United States Patent
Suzuki et al.

(10) Patent No.: US 10,036,959 B2
(45) Date of Patent: Jul. 31, 2018

(54) REFLECTION MASK AND PATTERN FORMATION METHOD

(71) Applicant: TOSHIBA MEMORY CORPORATION, Minato-ku (JP)

(72) Inventors: Masaru Suzuki, Kuwana (JP); Hiroyuki Mizuno, Kuwana (JP); Kazuyuki Yoshimochi, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 112 days.

(21) Appl. No.: 15/257,494

(22) Filed: Sep. 6, 2016

(65) Prior Publication Data

US 2017/0336721 A1   Nov. 23, 2017

(30) Foreign Application Priority Data

May 18, 2016 (JP) ................. 2016-099878

(51) Int. Cl.
*G03F 1/24* (2012.01)
*G03F 7/20* (2006.01)
*G03F 7/32* (2006.01)

(52) U.S. Cl.
CPC ............ *G03F 7/70283* (2013.01); *G03F 1/24* (2013.01); *G03F 7/2004* (2013.01); *G03F 7/2039* (2013.01); *G03F 7/322* (2013.01)

(58) Field of Classification Search
CPC ........ G03F 1/24; G03F 7/2004; G03F 7/2039; G03F 7/322; G03F 7/70283
USPC .................... 430/5, 325, 328, 331, 394, 967
See application file for complete search history.

(56) References Cited

U.S. PATENT DOCUMENTS 9,891,528 B2 *  2/2018  Liu ........................... G03F 7/40
2014/0242499 A1  8/2014  Takai et al.

FOREIGN PATENT DOCUMENTS

| JP | 2002-313694 | 10/2002 |
| JP | 2004-95980  | 3/2004  |
| JP | 2007-201306 | 8/2007  |
| JP | 2013-201315 | 10/2013 |
| JP | 2014-168019 | 9/2014  |

* cited by examiner

*Primary Examiner* — Christopher G Young
(74) *Attorney, Agent, or Firm* — Oblon, McClelland, Maier & Neustadt, L.L.P.

(57) ABSTRACT

According to one embodiment, there is provided a reflection mask including a multilayer reflection film configured to reflect EUV light or soft X-rays. The reflection mask includes a periodic pattern arrangement region in which first patterns are periodically arranged, and a non-periodic pattern arrangement region in which second patterns are non-periodically arranged. The non-periodic pattern arrangement region and the periodic pattern arrangement region differ from one another in reflectivity for the EUV light or the soft X-rays.

11 Claims, 10 Drawing Sheets

REFLECTION MASK AND PATTERN FORMATION METHOD

CROSS-REFERENCE TO RELATED APPLICATIONS

This application is based upon and claims the benefit of priority from Japanese Patent Application No. 2016-099878, filed on May 18, 2016; the entire contents of which are incorporated herein by reference.

FIELD

Embodiments described herein relate generally to a reflection mask and a pattern formation method.

BACKGROUND

Along with scaling of semiconductor devices, various light exposure techniques for forming fine patterns have been proposed. For example, there is known a light exposure apparatus (which will be referred to as an EUV light exposure apparatus, hereinafter) using extreme ultraviolet rays having a wavelength of about 100 nm or less (Extreme Ultraviolet Light: which will be referred to as EUV light, hereinafter). Further, other than this, there is also known a technique for forming fine patterns by combining an ArF immersion exposure tool with Dual Tone Development (which will be referred to as DTD, hereinafter).

The DTD is a technique that performs positive development and negative development. In the positive development, resist portions irradiated with light exposure energy of a certain level or more are dissolved by a development process. In the negative development, resist portions irradiated with light exposure energy of a certain level or less are dissolved by a development process. The certain level of the negative development differs from that of the positive development. With this technique, the pitch of periodic patterns is reduced to a half.

When the DTD is used, the pitch of periodic patterns can be reduced, but isolated patterns end up being processed such that only the outer peripheral portions of the isolated patterns are left. Accordingly, the DTD cannot be utilized to form isolated patterns.

DETAILED DESCRIPTION

In general, according to one embodiment, there is provided a reflection mask including a multilayer reflection film configured to reflect EUV light or soft X-rays. The reflection mask includes a periodic pattern arrangement region in which first patterns are periodically arranged, and a non-periodic pattern arrangement region in which second patterns are non-periodically arranged. The non-periodic pattern arrangement region and the periodic pattern arrangement region differ from one another in reflectivity for the EUV light or the soft X-rays.

Exemplary embodiments of a reflection mask and a pattern formation method will be explained below in detail with reference to the accompanying drawings. The present invention is not limited to the following embodiments. The sectional views of a reflection mask used in the following embodiments are schematic, and so the relationship between the thickness and width of each layer and/or the thickness ratios between respective layers may be different from actual states. Further, the film thicknesses shown hereinafter are mere examples, and they are not limiting.

First Embodiment

A reflection mask is a reticule used for a light exposure process using electromagnetic waves having wavelength of 100 nm or less. The electromagnetic waves having a wavelength of 100 nm or less include EUV light having a wavelength of 13 to 100 nm and soft X-rays having a wavelength of 0.6 to 13 nm. Hereinafter, a light exposure process using electromagnetic waves having a wavelength of 100 nm or less will be referred to as an EUV light exposure process.

Figure 1A:
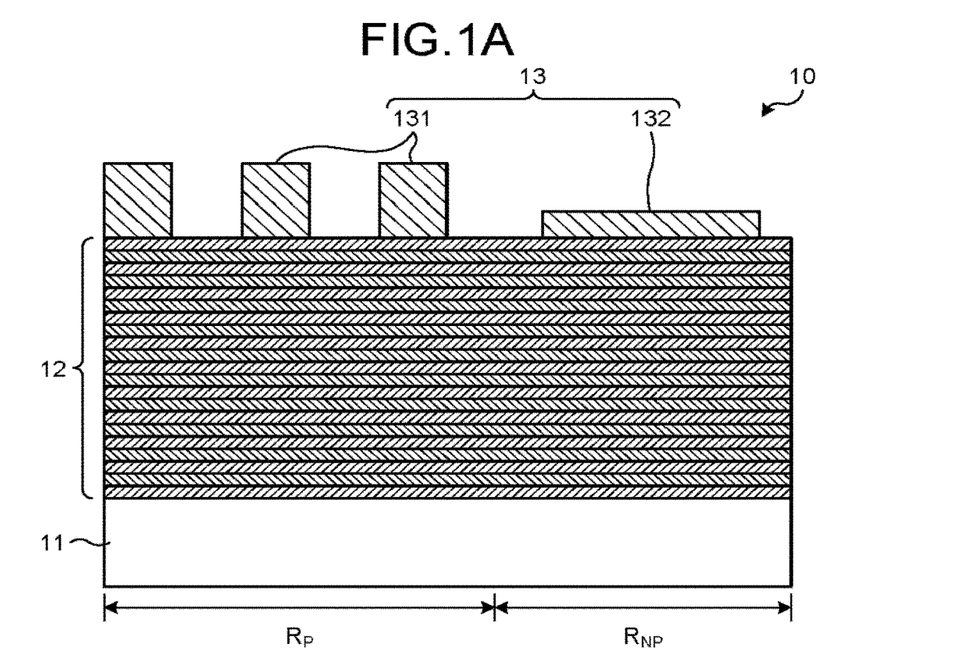
FIGS. 1A and 1B are partial sectional views schematically showing a configuration example of a reflection mask according to a first embodiment.
Figure 1B:
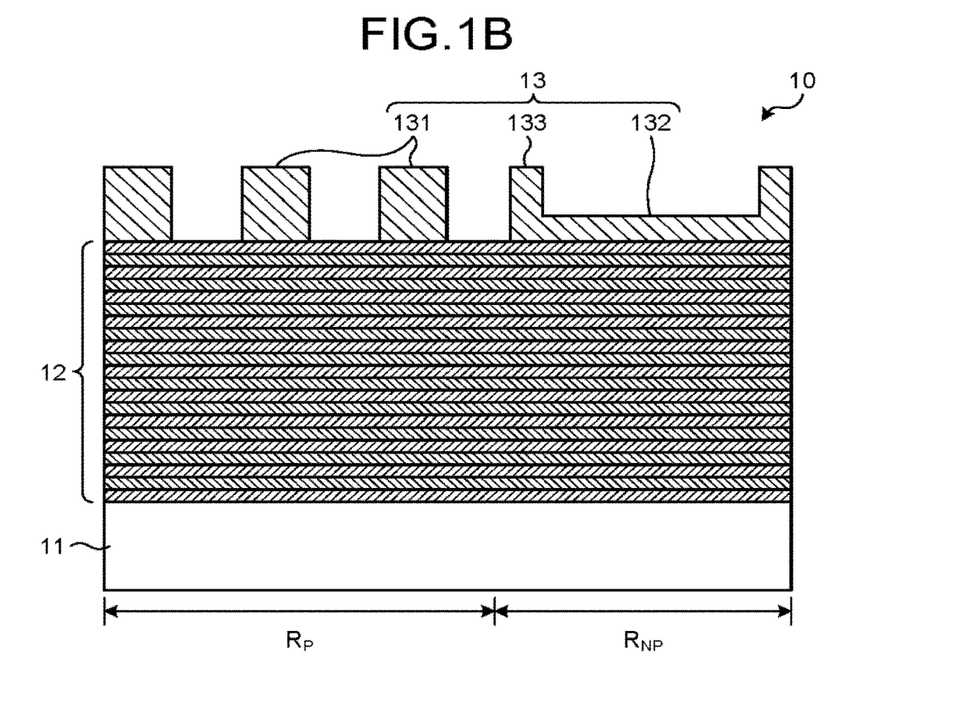

FIGS. 1A and 1B are partial sectional views schematically showing a configuration example of a reflection mask according to a first embodiment. The reflection mask 10 has a structure including a substrate 11 with a multilayer reflection film 12 and an absorber 13 disposed thereon in this order. As the substrate 11, a glass substrate having a low thermal expansivity or the like may be used. The multilayer reflection film 12 is disposed to reflect EUV light or soft X-rays. For example, as the multilayer reflection film 12, an Mo/Si multilayer film, which includes an Mn film and an Si film alternately stacked in a plurality of layers, is used. The Mo film has a thickness of 3 nm, for example, and the Si film has a thickness of 4 nm, for example. The absorber 13 has been patterned such that EUV light or soft X-rays are reflected by the reflection mask 10 to perform light exposure in a predetermined shape onto a light exposure object during the EUV light exposure process. For example, as the absorber 13, Ta, which can absorb EUV light and soft X-rays, is used.

The reflection mask 10 includes a periodic pattern arrangement region $R_P$ and a non-periodic pattern arrangement region $R_{NP}$. In the periodic pattern arrangement region $R_P$, patterns of a line and space form are disposed such that a plurality of linear patterns 131 are arranged at predetermined intervals in a direction perpendicular to their extending direction. The linear patterns 131 are patterns for forming lead-out wiring lines and routing wiring lines, as well as wiring lines that connect with device elements. Further, the linear patterns 131 may be formed of straight patterns or curved patterns, or may be formed of curved or straight patterns partly having corner portions. In the periodic pattern arrangement region $R_P$, linear patterns 131 are formed from the absorber 13, and serve as patterns for forming word lines disposed in the memory cell array of a LAND type flash memory, for example.

In the non-periodic pattern arrangement region $R_{NP}$, patterns (which will be referred to as non-periodic patterns, hereinafter) 132 are disposed such that they have a pitch larger than that of the linear patterns 131 in the periodic pattern arrangement region $R_P$. Unlike the linear patterns 131, most of the non-periodic patterns 132 are arranged separately in an isolated state from each other. In the non-periodic pattern arrangement region $R_{NP}$, non-periodic patterns 132 are formed from the absorber 13, and serve as patterns for forming device elements composing a peripheral circuit of a NAND type flash memory, for example.

In this embodiment, the thickness of the non-periodic patterns 132 of the non-periodic pattern arrangement region $R_{NP}$ is set smaller than the thickness of the linear patterns 131 of the periodic pattern arrangement region $R_P$, so that the linear patterns 131 and the non-periodic patterns 132 differ from each other in the reflectivity for EUV light or soft X-rays.

Here, the non-periodic pattern arrangement region $R_{NP}$ includes a portion for forming a pattern on a processing object and a portion for not forming a pattern on the processing object. The portion for forming a pattern on the processing object corresponds to each of the non-periodic patterns 132 described above. Further, in the portion for not forming a pattern, the absorber 13 is not present, as shown in FIG. 1A, or a dummy pattern 133 having the same height as the linear patterns 131 is present, as shown in FIG. 1B.

Figure 2:
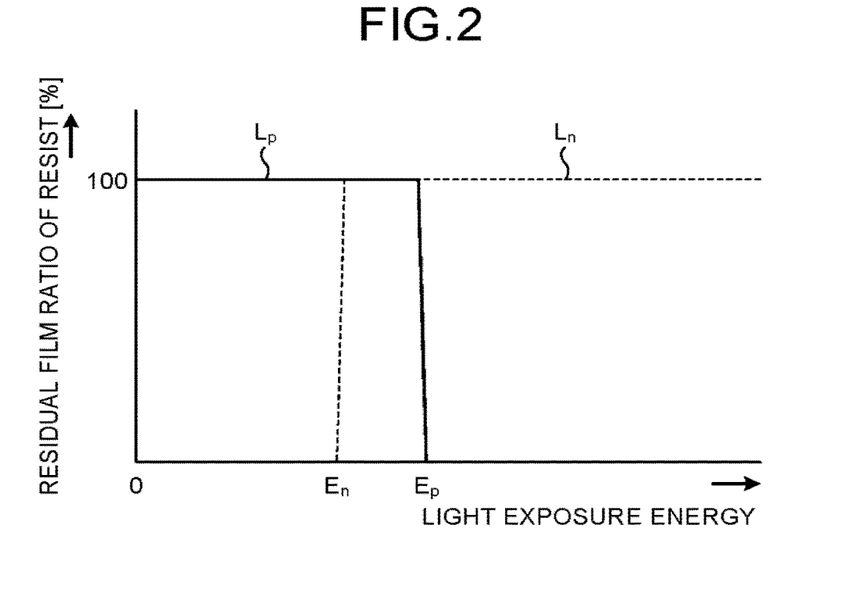
FIG. 2 is a view showing an example of the curve of a resist.

Next, an explanation will be given of a summary of a lithography process that combines the EUV light exposure process with the DTD. A processing object is coated with a resist that serves as the positive type by use of a first developing solution and serves as the negative type by use of a second developing solution. This resist is a resist that has sensitivity in the wavelength region of EUV light or soft X-rays. FIG. 2 is a view showing an example of the γ curve of the resist. FIG. 2 illustrates characteristic curves representing the relationship between the light exposure energy (light exposure amount) on the resist and the residual film ratio of the resist after development, in which the horizontal axis indicates the light exposure energy, and the vertical axis indicates the residual film ratio of the resist. The γ curve obtained by use of the first developing solution (the positive type) is shown by a curve $L_p$, and the γ curve obtained by use of the second developing solution (the negative type) is shown by a curve $L_n$.

In the case of a positive type resist, when development is performed, light-exposed portions are dissolved and light-unexposed portions are left. On the other hand, in the case of a negative type resist, when development is performed, light-unexposed portions are dissolved and light-exposed portions are left. Accordingly, if the light exposure energy E falls within a range of $E_n<E<E_p$, the resist having sensitivity in the wavelength region of EUV light or soft X-rays becomes insoluble in use of either of the first developing solution and the second developing solution.

According to the DTD, the resist is applied onto the processing object, and then development is performed by use of the first developing solution of the positive type, so that portions with a light exposure energy of $E_p$ or more are removed. Then, development is performed by use of the second developing solution of the negative type, so that portions with a light exposure energy of $E_n$ or less are removed. Consequently, only resist portions with a light exposure energy within an intermediate range between $E_n$ and $E_p$ are left, and thereby resist patterns are formed.

At the areas with a light exposure energy of more than $E_p$ or at the areas with a light exposure energy of less than $E_n$, portions of the resist are dissolved by the first developing solution or the second developing solution, and thereby resist patterns are not formed. At the areas of the processing object where the non-periodic patterns 132 of the non-periodic pattern arrangement region $R_{NP}$ are projected, a light exposure process is performed to leave non-periodic patterns that are larger than linear patterns. Accordingly, the thickness of the absorber 13 is determined such that the light exposure energy E satisfies $E_n<E<E_p$, for irradiation of the areas of the processing object where the non-periodic patterns 132 are projected. In other words, in order to achieve that the light exposure energy satisfies $E_n<E<E_p$ at the areas of the processing object where the non-periodic patterns 132 are projected, the reflectivity at the non-periodic patterns 132 of the non-periodic pattern arrangement region $R_{NP}$ is determined, and then the thickness of the absorber 13 is determined to realize this reflectivity.

Figure 3:
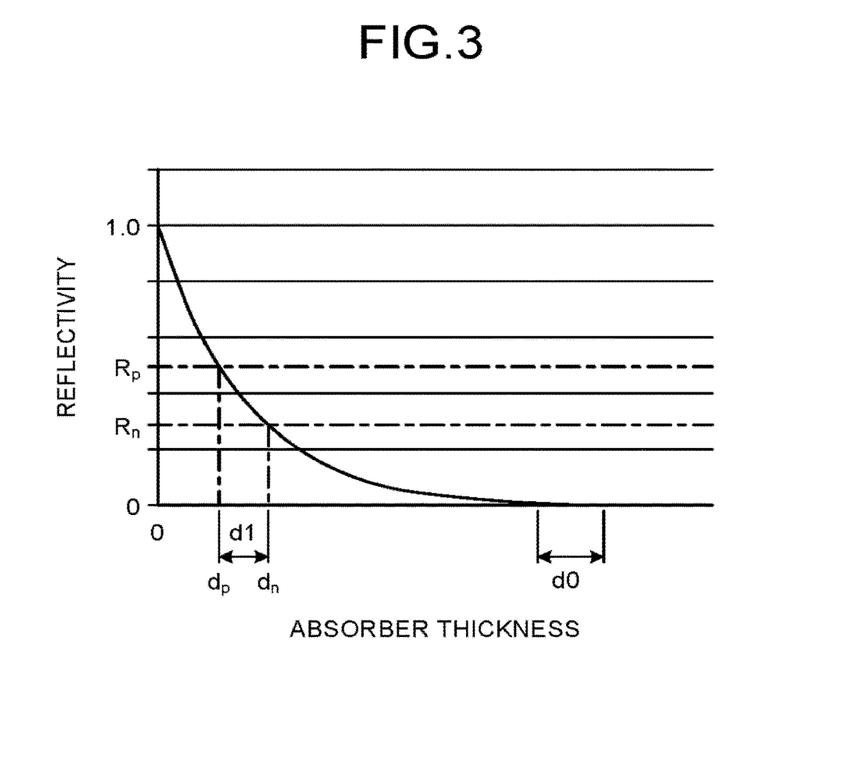
FIG. 3 is a view schematically showing an example of the relationship between the film thickness of an absorber and the reflectivity for EUV light or soft X-rays.

FIG. 3 is a view schematically showing an example of the relationship between the film thickness of the absorber and the reflectivity for EUV light or soft X-rays. In FIG. 3, the horizontal axis indicates the film thickness of the absorber 13, and the vertical axis indicates the reflectivity in a state where the absorber 13 is disposed on the multilayer reflection film 12. Here, in order to achieve that the light exposure energy E satisfies $E_n<E<E_p$ at the areas of the processing object where the non-periodic patterns 132 are projected, it is assumed that the reflectivity R at the non-periodic patterns 132 satisfies $R_n<R<R_p$. In this case, the thickness d1 of the absorber 13 comes to satisfy $d_p<d1<d_n$, as shown in FIG. 3.

At the positions of the periodic pattern arrangement region $R_P$ where reflection of EUV light o soft X-rays is suppressed as far as possible, the thickness of the absorber 13 is set to d0, with which the reflectivity becomes 0, as shown in FIG. 3. On the other hand, at the arrangement positions of the non-periodic patterns 132 in the non-periodic pattern arrangement region $R_{NP}$, the thickness d1 of the absorber 13 is set to satisfy $d_p<d1<d_n$, as described above, and is smaller than d0, as shown in FIG. 3. In a non-limiting example, the thickness de of the absorber 13 formed the periodic pattern arrangement region $R_P$ is set to 50 to 80 nm, and the thickness d1 of the absorber 13 forming the non-periodic patterns 132 in the non-periodic pattern arrangement region $R_{NP}$ is set to 10 to 15 nm.

As described above, the non-periodic pattern arrangement region $R_{NP}$ has a configuration provided with the non-periodic patterns 132 formed from the absorber 13. However, since their thickness is smaller than that of the absorber 13 of the periodic pattern arrangement region $R_P$, EUV light or soft X-rays can be reflected even at the arrangement positions of the non-periodic patterns 132. As a result, the light exposure energy E satisfies $E_n<E<E_p$ at the areas of the processing object where the non-periodic patterns 132 are projected.

Figure 4A:
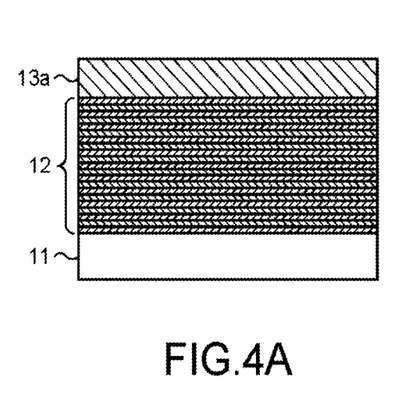
FIGS. 4A to 4E are sectional views schematically showing an example of the sequence of a reflection mask manufacturing method according to the first embodiment.

Next, an explanation will be given of a method of manufacturing the reflection mask 10. FIGS. 4A to 4E are sectional views schematically showing an example of the sequence of a reflection mask manufacturing method according to the first embodiment. At first, as shown in FIG. 4A, a multilayer reflection film 12 is formed on a substrate 11, and an absorber film 13a is formed on the multilayer reflection film 12. As the substrate 11, a low thermal expansion glass or the like is used. As the multilayer reflection film 12, an Mo/Si multilayer film, which includes a plurality of Mo/Si pairs stacked as layers, or the like is used. The thickness of each Mo film is set to about 3 nm, for example, and the thickness of each Si film is set to about 4 nm, for example. The multilayer reflection film 12 is composed of 50 Mo/Si pairs stacked as layers, for example. The absorber film 13a is a film to be patterned and thereby used as an absorber 13. As the absorber film 13a, a Ta film or the like is used. The thickness of the absorber film 13a is set to 70 nm, for example.

Figure 4B:
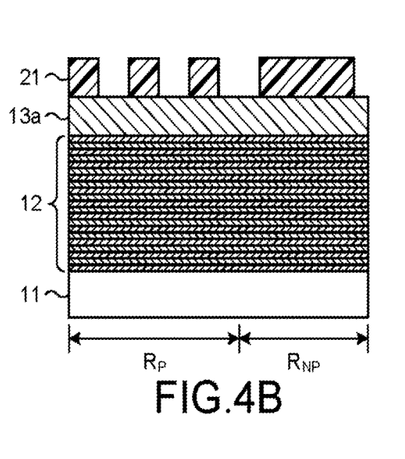

Then, as shown in FIG. 45, a resist is applied onto the absorber film 13a, and is patterned into a predetermined shape by use of an electron beam lithography technique and a development process, so that resist patterns 21 are formed. For example, in the periodic pattern arrangement region $R_P$, light exposure is performed by use of an electron beam to have linear patterns arranged in a line and space form. In the non-periodic pattern arrangement region $R_{NP}$, light exposure is performed by use of an electron beam to leave portions to correspond to device element formation positions. After the light exposure, development is performed, so that the resist patterns 21 are formed.

Figure 4C:
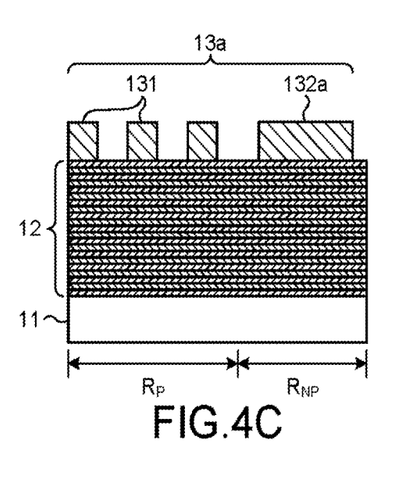

Thereafter, as shown in FIG. 4C, the absorber film 13a is processed, through the resist patterns 21 serving as a mask, by use of anisotropic etching, such as an RIE (Reactive Ton Etching) method. At this time, portions of the absorber film 13a are removed at the areas not covered with the resist patterns 21. After the etching, the resist patterns 21 are removed by use of a resist stripping technique. Consequently, the absorber film 13a is patterned such that the periodic pattern arrangement region $R_P$ is provided with linear patterns 131 of a line and space form and that the non-periodic pattern arrangement region $R_{NP}$ is provided with non-periodic patterns 132a having the same height as the linear patterns 131.

Figure 4D:
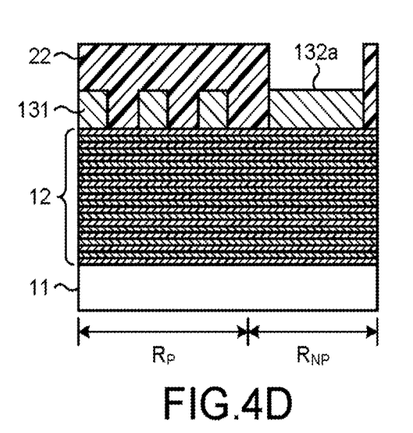

Then, as shown in FIG. 4D, a resist is applied onto the substrate 11 including the patterned absorber film 13a, and resist patterns 22, which expose the non-periodic patterns 132a of the non-periodic pattern arrangement region $R_{NP}$, are formed by use of a lithography technique.

Figure 4E:
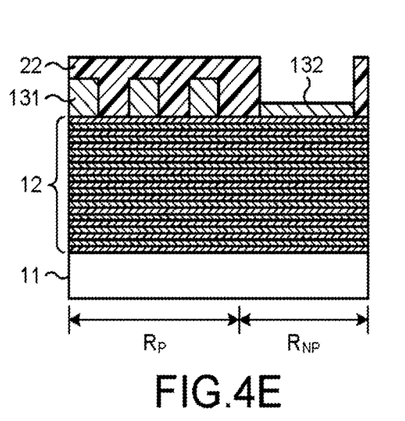

Thereafter, as shown in FIG. 4E, the absorber film 13a in the non-periodic pattern arrangement region $R_{NP}$ is etched by a predetermined amount, through the resist patterns 22 serving as a mask, by use of anisotropic etching, such as an RIE method. The absorber film 13a is etched such that, during a light exposure process, EUV light or soft X-rays reflected by the non-periodic patterns 132 have a light exposure energy E that satisfies $E_n<E<E_p$ on the processing object (the reflectivity of the non-periodic patterns 132 satisfies $R_n<R<R_p$). For example, the etching is performed until the thickness of the non-periodic patterns 132a becomes 15 nm. Then, the resist patterns 22 are removed by use of a resist stripping technique, so that the reflection mask 10 shown in FIG. 1A is obtained.

On the other hand, in the case where the reflection mask 10 shown in FIG. 1B is formed, the processes shown in FIGS. 42 and 4C are performed such that portions of the absorber film 13a are additionally left at positions other than the arrangement positions of the non-periodic patterns 132 in the non-periodic pattern arrangement region $R_{NP}$.

Figure 5A:
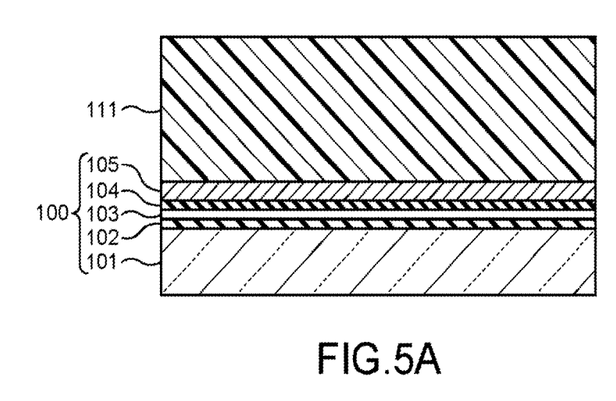
FIGS. 5A to 5F are sectional views schematically showing an example of the sequence of a pattern formation method according to the first embodiment.

Next, an explanation will be given of a pattern formation method using the reflection mask 10 according to the first embodiment. FIGS. 5A to 5B are sectional views schematically showing an example of the sequence of pattern formation method according to the first embodiment. At first, as shown in FIG. 5A, a resist 111 is applied onto a processing object 100. The processing object 100 is exemplified by a structure including a tunnel insulating film 102, a charge accumulation film 103, an inter-electrode insulating film 104, and a control gate electrode film 105 stacked in this order on a semiconductor substrate 101. This processing object 100 is used for forming a NAND type flash memory. As the tunnel insulating film 102, an example is an insulating film, such as a silicon oxide film. As the charge accumulation film 103, an example is a semiconductor film, such as a silicon film, or an insulating film, such as a nitride film. As the inter-electrode insulating film 104, an example is an insulating film, such as a silicon oxide film. As the control gate electrode film 105, an example is a semiconductor film, such as a silicon film In the NAND type flash memory, a memory cell array part $R_{MC}$ is provided with periodic patterns formed of word lines arranged in a line and space form, and a peripheral circuit part $R_{PE}$ is provided with non-periodic patterns, such as a field effect transistor.

Further, the resist 111 employed here has a composition that can be developed by a development process subsequently performed by use of a positive type developing solution and a negative type developing solution, and Is made of a material having sensitivity in the wavelength region of EUV light or soft X-rays.

Figure 5B:
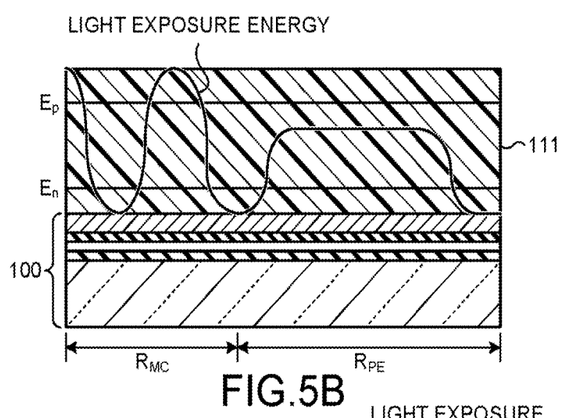

Then, as shown in FIG. 5B, an EUV light exposure process is performed by use of the reflection mask 10 shown in FIG. 1B. FIG. 5B illustrates an example of an intensity distribution about the light exposure energy of EUV light or soft X-rays in the resist 111. As shown in FIG. 5B, the light exposure energy is smaller at positions corresponding to the arrangement positions of the absorber 13 of the reflection mask 10, and the light exposure energy is larger at positions corresponding to the positions not provided with the absorber 13. Further, in the peripheral circuit part $R_{PE}$, the light exposure energy is larger than $E_n$ and smaller than $E_p$ at positions corresponding to the arrangement positions of the non-periodic patterns 132.

Figure 5C:
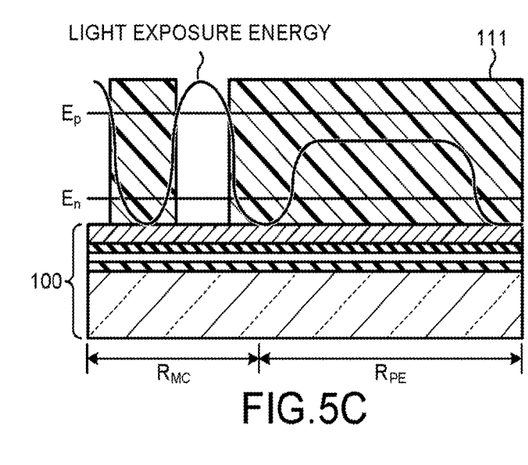

Thereafter, as shown in FIG. 5C, a development process is performed by use of the positive type developing solution. As the positive type developing solution, an example is an aqueous solution of tetramethylammonium hydroxide or the like. Consequently, portions of the resist 111 are removed at the areas irradiated with a light exposure energy of $E_p$ or more. Accordingly, portions of the resist 111 are not removed at the areas corresponding to the spaces between the linear patterns 131 of the periodic pattern arrangement region $R_P$ of the reflection mask 10 and at the area corresponding to the non-periodic pattern arrangement region $R_{NP}$.

Figure 5D:
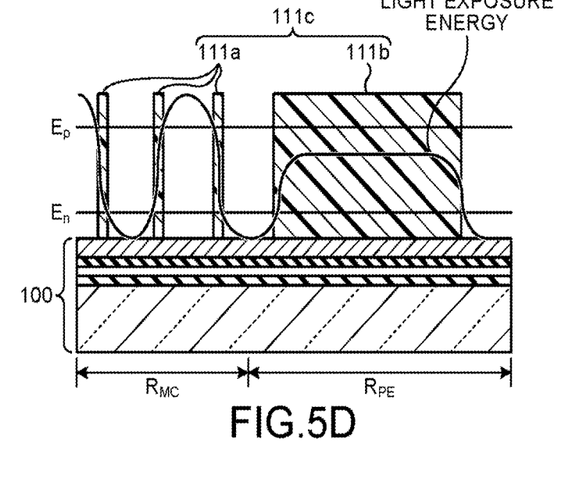

Then, as shown in FIG. 5D, a development process is performed by use of the negative type developing solution. As the negative type developing solution, an example is an aqueous solution of butyl acetate or a mixture solution of anisole and methylisobutyl ketone. Consequently, portions of the resist 111 at the areas with a light exposure energy of $E_n$ or less are removed. Specifically, in the memory cell array part $R_{MC}$, linear patterns 111a are arranged in a line and space form. Further, in the peripheral circuit part $R_{PE}$, isolated non-periodic patterns 111b are formed. As a result, resist patterns 111c for processing the processing object 100 are formed.

Figure 5E:
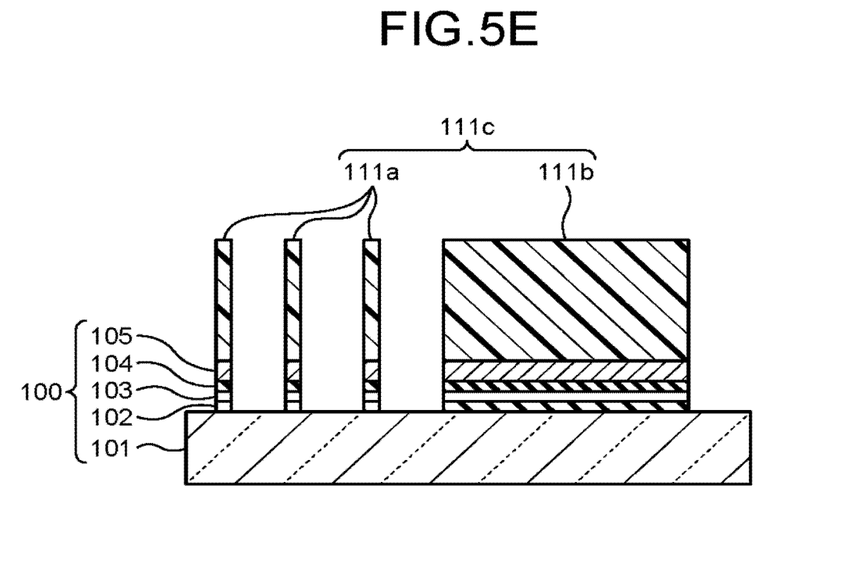
Figure 5F:
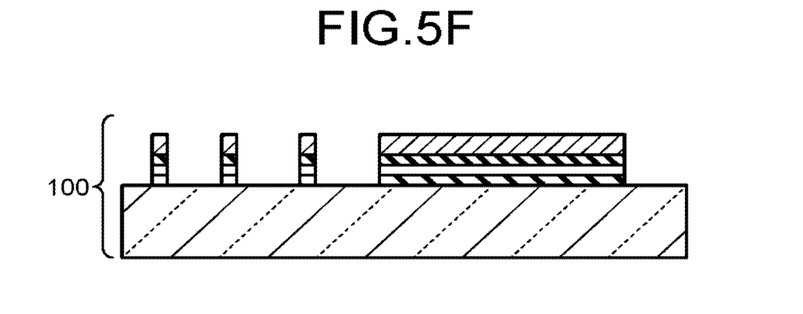

Thereafter, as shown in FIG. 5E, the control gate electrode film 105, the inter-electrode insulating film 104, the charge accumulation film 103, and the tunnel insulating film 102 are etched, through the resist patterns 111c serving as a mask, by use of anisotropic etching, such as an RIE method. Consequently, the patterns formed by the resist patterns 111c are transferred onto the processing object 100. Then, as shown in FIG. 5F, the resist patterns 111c are removed, and thereby the NAND type flash memory is formed. As a result, the pattern formation method ends.

Figure 6:
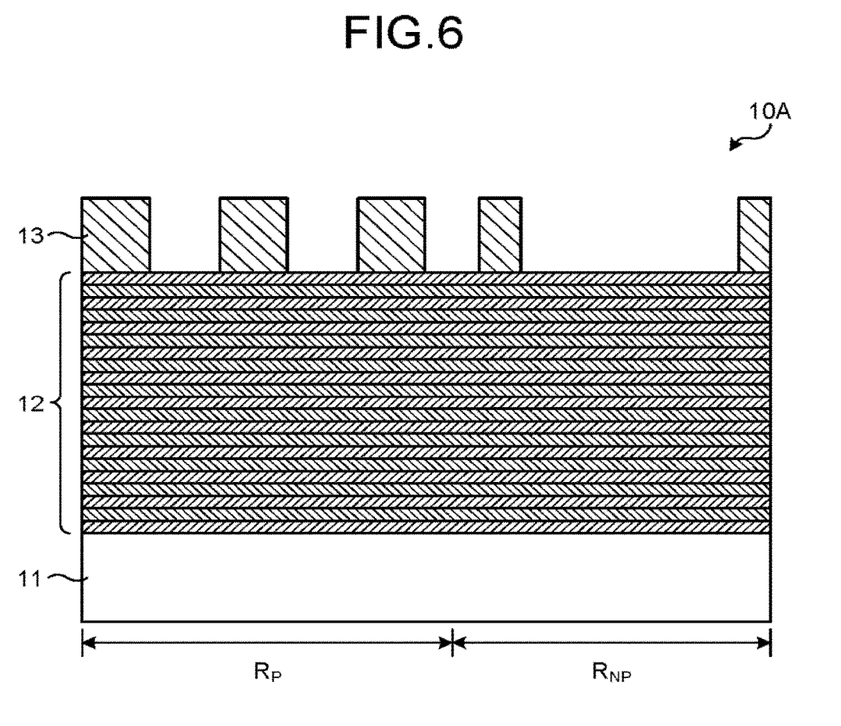
FIG. 6 is a partial sectional view schematically showing an example of a reflection mask according to a comparative example.

Next, an explanation will be given of an effect of the first embodiment, as compared with a comparative example. FIG. 6 is a partial sectional view schematically showing an example of a reflection mask according to the comparative example. As shown in FIG. 6, the reflection mask 10A according to the comparative example is configured such that, in the non-periodic pattern arrangement region $R_{NP}$, the absorber 13 is not present at positions for forming non-periodic patterns and the absorber 13 remains at positions for not forming non-periodic patterns. The height of the absorber 13 in the non-periodic pattern arrangement region $R_{NP}$ is set the same as the height of the absorber 13 in the periodic pattern arrangement region $R_P$.

Figure 7A:
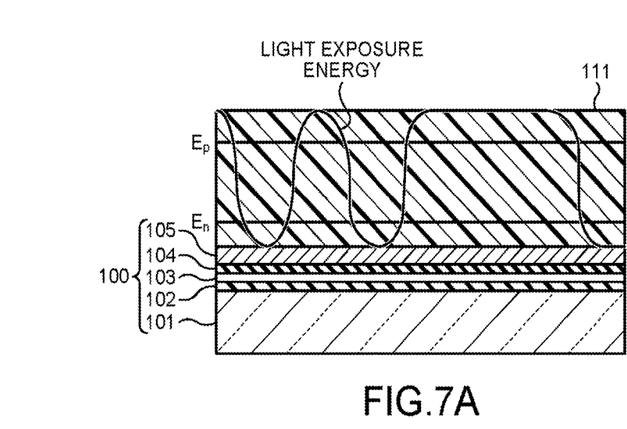
FIGS. 7A to 7D are sectional views schematically showing an example of the sequence of a pattern formation method using the reflection mask according to the comparative example.

FIGS. 7A to 7D are sectional views schematically showing an example of the sequence of a pattern formation method using the reflection mask according to the comparative example. At first, as described with reference to FIG. 5A, the resist 111 is applied onto the processing object 100. Then, as shown in FIG. 7A, the EUV light exposure process is performed by use of the reflection mask 10A shown in FIG. 6. FIG. 7A illustrates an example of an intensity distribution about the light exposure energy of EUV light or soft X-rays in the resist 111. As shown in FIG. 7A, the light exposure energy is smaller at positions corresponding to the arrangement positions of the absorber 13 of the reflection mask 10A, and the light exposure energy is larger at positions corresponding to the positions not provided with the absorber 13. Unlike the case shown in FIG. 5B, the light exposure energy is larger than $E_p$ at positions corresponding to the positions of the reflection mask 10A where the absorber 13 for forming non-periodic patterns is not disposed.

Figure 7B:
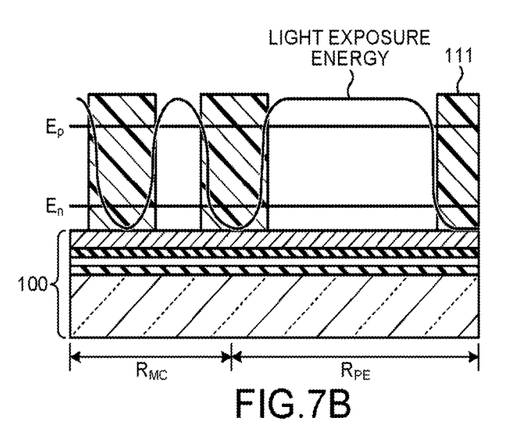

Thereafter, as shown in FIG. 7B, a development process is performed by use of the positive type developing solution. In this development process, portions of the resist 111 are removed at the areas with a light exposure energy of $E_p$ or more. Accordingly, in the peripheral circuit part $R_{PE}$, portions of the resist 111 are not removed at the peripheral edge of the positions where non-periodic patterns are supposed to be formed and at the areas where non-periodic patterns are not formed, and portions of the resist 111 are removed at the areas other than the peripheral edge of the positions where non-periodic patterns are supposed to be formed.

Figure 7C:
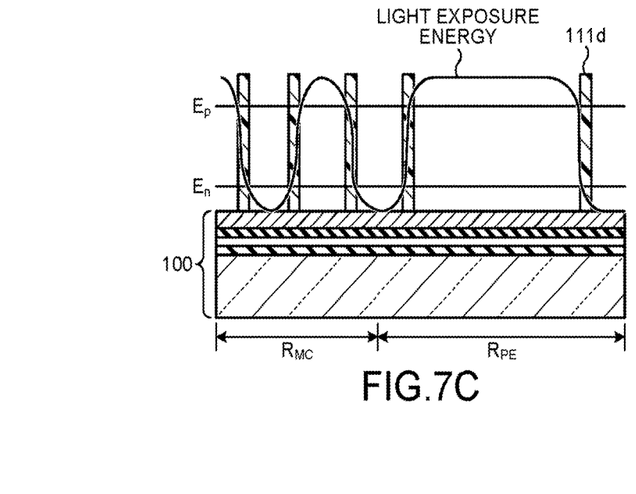
Figure 7D:
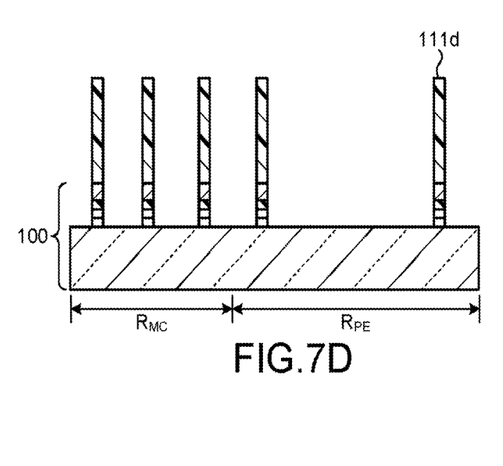

Then, as shown in FIG. 7C, a development process is performed by use of the negative type developing solution. In this development process, portions of the resist 111 at the areas with a light exposure energy of $E_n$ or less are removed. Consequently, in the memory cell array part $R_{MC}$, linear patterns are arranged in a line and space form. Further, in the peripheral circuit part $R_{PE}$, portions of the resist 111 are removed around the positions where non-periodic patterns are supposed to be formed. As a result, resist patterns 111d are formed such that they include linear patterns of a line and space form disposed in the memory cell array part $R_{MC}$ and a ring-like pattern disposed at the peripheral edge of the positions where non-periodic patterns are supposed to be formed in the peripheral circuit part $R_{PE}$. However, non-periodic patterns cannot be formed by use of this resist patterns 111d.

On the other hand, according to the first embodiment, the reflection mask 10 includes the absorber 13 disposed in the non-periodic pattern arrangement region $R_{NP}$, at positions for forming patterns, so that the reflectivity for EUV light or soft X-rays becomes lower than that of the periodic pattern arrangement region $R_P$. Consequently, even if a development process is performed by use of the DTD, patterns of a line and space form and non-periodic patterns can be formed on the processing object at the same time. As a result, it is possible to reduce the cost for manufacturing semiconductor devices.

Second Embodiment

In the first embodiment, an explanation has been given of the reflection mask employing the absorber patterned on the multilayer reflection film. As a reflection mask, there is a digging type structure that does not employ the absorber but includes patterns of the multilayer reflection film. In the second embodiment, an explanation will be given of a reflection mask having the digging type structure.

Figure 8A:
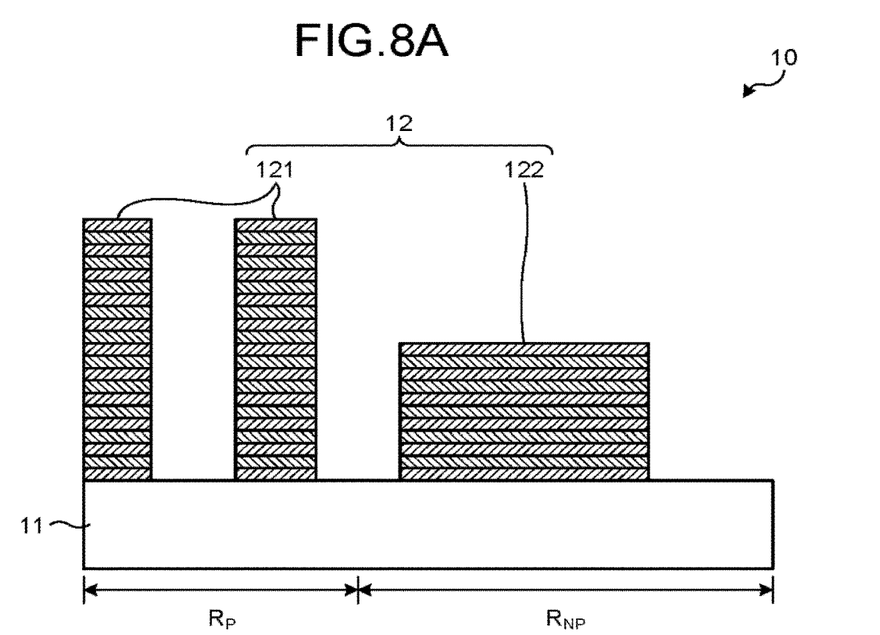
FIGS. 8A and 8B are partial sectional views schematically showing a configuration example of a reflection mask according to a second embodiment.
Figure 8B:
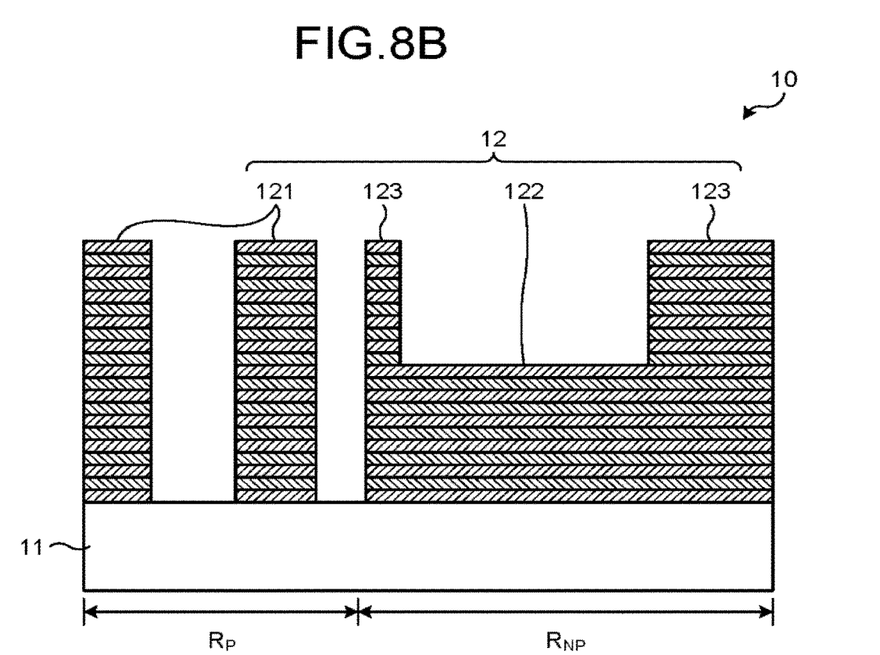

FIGS. 8A and 8B are partial sectional views schematically showing a configuration example of a reflection mask according to the second embodiment. The reflection mask 10 has a structure including a substrate 11 with a patterned multilayer reflection film 12 disposed thereon. As the substrate 11, a glass substrate having a low thermal expansivity or the like may be used. The multilayer reflection film 12 is disposed to reflect EUV light or soft X-rays. For example, as the multilayer reflection film 12, an Mo/Si multilayer film, which includes an Mo film and an Si film alternately stacked in a plurality of layers, is used.

The reflection mask 10 include a periodic pattern arrangement region $R_P$ and a non-periodic pattern arrangement region $R_{NP}$. In the periodic pattern arrangement region $R_P$, the multilayer reflection film 12 is patterned in a plurality of linear patterns 121. The plurality of linear patterns 121 are arranged at predetermined intervals in a direction perpendicular to their extending direction.

In the non-periodic pattern arrangement region $R_{NP}$, the multilayer reflection film 12 is patterned in non-periodic patterns 122 isolated from the other patterns. The pitch between adjacent non-periodic patterns 122 is larger than the pitch of the linear patterns 121. Further, the thickness of the non-periodic patterns 122 in the non-periodic pattern arrangement region $R_{NP}$ is set smaller than the thickness of the multilayer reflection film 12 (linear patterns 121) in the periodic pattern arrangement region $R_P$, so that the periodic pattern arrangement region $R_P$ and the non-periodic patterns 122 of the non-periodic pattern arrangement region $R_{NP}$ differ from each other in the reflectivity for EUV light or soft X-rays.

Here, the non-periodic pattern arrangement region $R_{NP}$ includes a portion for forming a pattern on a processing object and a portion for not forming a pattern on the processing object. The portion for forming a pattern on the processing object corresponds to each of the non-periodic patterns 122 described above. Further, in the portion for not forming a pattern, the multilayer reflection film 12 is not present, as shown in FIG. 8A, or a dummy pattern 123 having the same height as the linear patterns 121 is present, as shown in FIG. 8B.

As described in the first embodiment, in a lithography process that combines the EUV light exposure process with the DTD, a resist having the γ curve shown in FIG. 2 is used. Then, the thickness of the multilayer reflection film 1 is determined such that the light exposure energy E satisfies $E_n<E<E_p$, for irradiation of the areas of the processing object where the non-periodic patterns 122 are projected. In other words, in order to achieve that the light exposure energy E satisfies $E_n<E<E_p$ at the areas of the processing object where the non-periodic patterns 122 are projected, the reflectivity at the non-periodic patterns 122 is determined, and then the thickness of the multilayer reflection film 12 is determined to realize this reflectivity.

Figure 9:
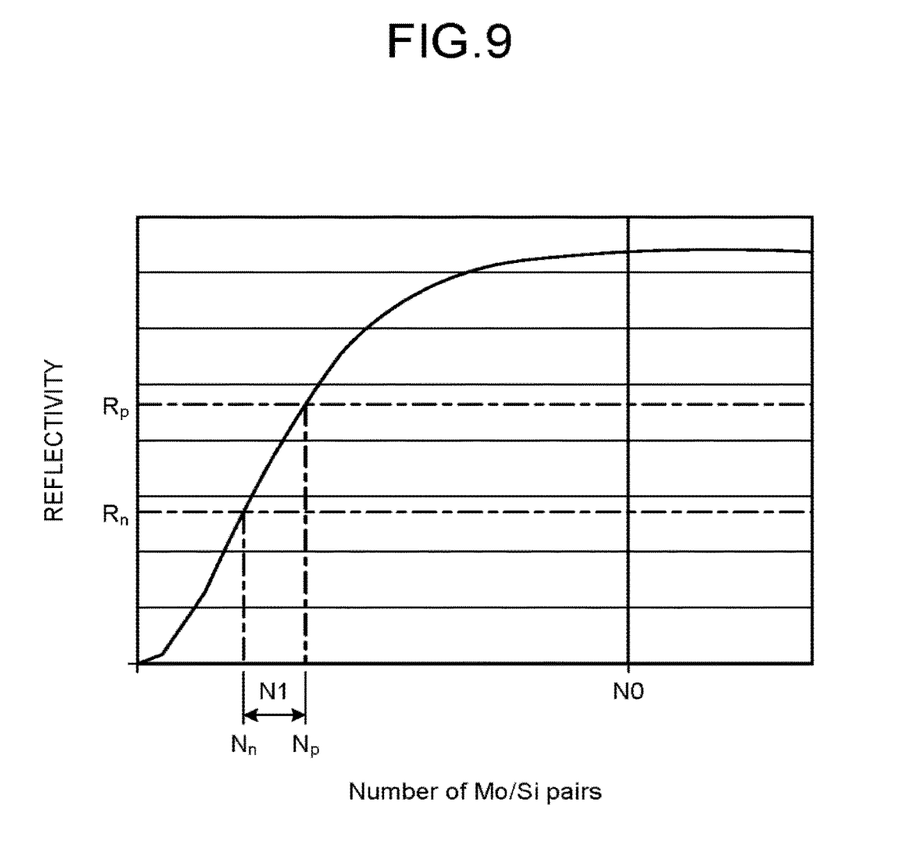
FIG. 9 is a view schematically showing an example of the relationship between the number of Mo/Si pairs in a multilayer reflection film and the reflectivity for EUV light or soft X-rays.

FIG. 9 is a view schematically showing an example of the relationship between the number of Mo/Si pairs in the multilayer reflection film and the reflectivity for EUV light or soft X-rays. In FIG. 9, the horizontal axis indicates the number of Mo/Si pairs in the multilayer reflection film 12, and the vertical axis indicates the reflectivity of the multilayer reflection film 12. Here, in order to achieve that the light exposure energy E satisfies $E_n<E<E_p$ at the areas of the processing object where the non-periodic patterns 122 are projected, it is assumed that the reflectivity R at the non-periodic patterns 122 satisfies $R_n<R<R_p$. In this case, the number N1 of Mo/Si pairs in the multilayer reflection film 12 comes to satisfy $N_n<N1<N_p$, as shown in FIG. 9.

In the periodic pattern arrangement region $R_P$, in order to increase the reflectivity at portions provided with patterns, the number of Mo/Si pairs in the multilayer reflection film 12 is set to N0, with which the reflectivity is saturated. Further, in order to set the reflectivity to 0 at the portions not provided with patterns, the number of Mo/Si pairs in multilayer reflection film 12 is set to 0 at the portions not provided with patterns. On the other hand, at the pattern formation positions in the non-periodic pattern arrangement region $R_{NP}$, in order to leave portions of the resist on the processing object, the number of Mo/Si pairs in the multilayer reflection film 12 is set to satisfy $N_n<N1<N_p$, as described above, and is smaller than N0.

As described above, since the thickness of the multilayer reflection film 12 at the non-periodic patterns 122 is smaller than the thickness of the multilayer reflection film 12 at the linear patterns 121 of the periodic pattern arrangement region $R_p$, EUV light or soft X-rays can be reflected even at the arrangement positions of the non-periodic patterns 122. As a result, the light exposure energy E satisfies $E_n<E<E_p$ at the area of the processing object where the non-periodic pattern arrangement region $R_{NP}$ is projected. In a non-limiting example, the multilayer reflection film 12 is composed of 30 to 60 Mo/Si pairs stacked as layers at the linear patterns 121, and the multilayer reflection film 12 is composed of 5 to 15 Mo/Si pairs stacked as layers at the non-periodic patterns 122.

Figure 10A:
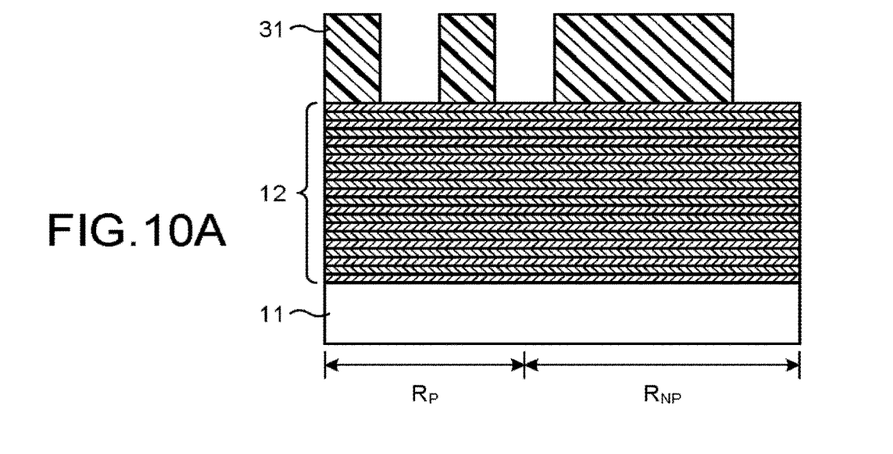
FIGS. 10A to 10C are sectional views schematically showing an example of the sequence of a reflection mask manufacturing method according to the second embodiment.

Next, an explanation will be given of a method of manufacturing the reflection mask 10. FIGS. 10A to 10C are sectional views schematically showing an example of the sequence of a reflection mask manufacturing method according to the second embodiment. At first, as shown in FIG. 10A, a multilayer reflection film 12 is formed on a substrate 11. As the substrate 11, a low thermal expansion glass or the like is used. As the multilayer reflection film 12, an Mo/Si multilayer film, which includes Mo/Si pairs stacked as, e.g., 60 layers, or the like is used.

Further, a resist applied onto the multilayer reflection film 12, and is patterned into a predetermined shape by use of an electron beam lithography technique and a development process, so that resist patterns 31 are formed. For example, in the periodic pattern arrangement region $R_P$, light exposure is performed by use of an electron beam to have linear patterns arranged in a line and space form. In the non-periodic pattern arrangement region $R_{NP}$, light exposure is performed by use of an electron beam to leave portions to correspond to device element formation positions. After the light exposure, development is performed, so that the resist patterns 31 are formed.

Figure 10B:
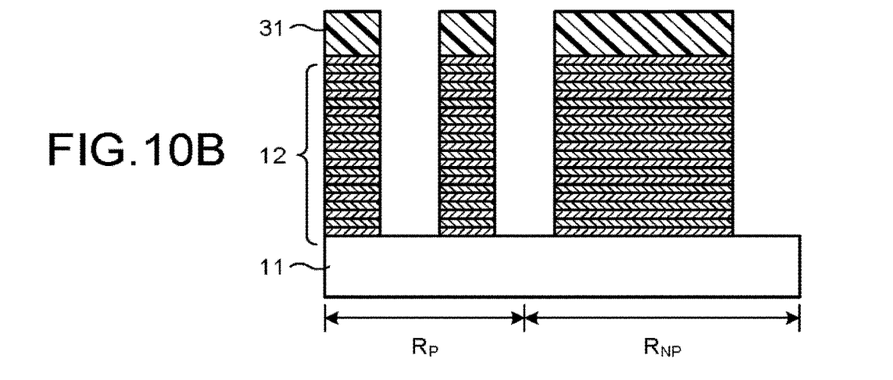

Thereafter, as shown in FIG. 10B, the multilayer reflection film 12 is processed, through the resist patterns 31 serving as a mask, by use of anisotropic etching, such as an RIE method. At this time, portions of the multilayer reflection film 12 are removed at the areas of the substrate 11 not covered with the resist patterns 31. After the etching, the resist patterns 31 are removed by use of a resist stripping technique.

Figure 10C:
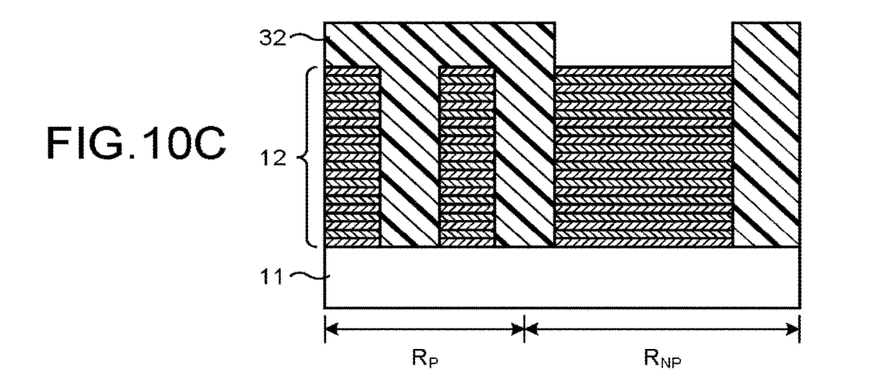

Then, as shown in FIG. 10C, a resist is applied onto the substrate 11 including the patterned multilayer reflection film 12. Further, resist patterns 32, which expose the non-periodic patterns 122 in the non-periodic pattern arrangement region $R_{NP}$, are formed by use of a lithography technique and a development process.

Thereafter, the non-periodic patterns 122 are etched by a predetermined amount, through the resist patterns 32 serving as a mask, by use of anisotropic etching, such as an RIE method. The etching conditions are controlled to set the number of Mo/Si pairs to N1, with which, during a light exposure process, EUV light or soft X-rays reflected by the non-periodic patterns 122 have a light exposure energy E that satisfies $E_n<E<E_p$ on the processing object (the reflectivity of the non-periodic patterns 122 satisfies $R_n<R<R_p$). Here, for example, the etching is performed until the multilayer reflection film 12 at the non-periodic patterns 122 comes to be composed of 15 Mo/Si pairs stacked as layers. Then, the resist patterns 32 are removed by use of a resist stripping technique, so that the reflection mask 10 shown in FIG. 8A is obtained.

On the other hand, in the case where the reflection mask 10 shown in FIG. 8B is formed, the process shown in FIGS. 10A is performed to form resist patterns 31 to coverer the entirety of the non-periodic pattern arrangement region $R_{NP}$, and the process shown in FIG. 10C is performed to form resist patterns 32 to cover portions other than the arrangement positions of the non-periodic patterns 122 in the non-periodic pattern arrangement region $R_{NP}$.

A pattern formation method using the reflection mask 10 according to the second embodiment is same as that of the first embodiment shown in FIGS. 5A to 5F, and so its description will be omitted.

The second embodiment can provide the same effects as the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method comprising:
applying a resist onto a processing object;

performing light exposure to the resist by use of a reflection mask including a multilayer reflection film configured to reflect EUV light or soft X-rays;

performing development using a first developing solution to areas exposed to light with a light exposure energy larger than a first light exposure energy; and performing development using a second developing solution to areas exposed to light with a light exposure energy smaller than a second light exposure energy, wherein the reflection mask includes a periodic pattern arrangement region in which first patterns are periodically arranged, and a non-periodic pattern arrangement region in which second patterns are non-periodically arranged, and the non-periodic pattern arrangement region and the periodic pattern arrangement region differ from one another in reflectivity for the EUV light or the soft X-rays.

2. The pattern formation method according to claim 1, wherein the reflectivity of the non-periodic pattern arrangement region of the reflection mask is lower than the reflectivity of the periodic pattern arrangement region.

3. The pattern formation method according to claim 1, wherein the reflection mask further includes an absorber absorbing the EUV light or the soft X-rays, which is disposed on the multilayer reflection film and constitutes the first patterns and the second patterns, and a thickness of the absorber constituting the second patterns is smaller than a thickness of the absorber constituting the first patterns.

4. The pattern formation method according to claim 3, wherein the second patterns of the reflection mask are constituted by the absorber disposed at positions corresponding to positions leaving resist patterns on the processing object.

5. The pattern formation method according to claim 4, wherein the second patterns of the reflection mask are constituted by the absorber having a first thickness, the first thickness being a thickness providing a reflectivity with which a light exposure energy at positions of the resist corresponding to arrangement positions of the second patterns becomes larger than the second light exposure energy and smaller than the first light exposure energy.

6. The pattern formation method according to claim 3, wherein the multilayer reflection film is an Mo multilayer film, which includes an Mo film and an Si film alternately stacked in a plurality of layers, and the absorber is a Ta film.

7. The pattern formation method according to claim 1, wherein the first patterns and the second patterns are constituted by the multilayer reflection film, and the second patterns have a thickness smaller than a thickness of the first patterns.

8. The pattern formation method according to claim 7, wherein, in the non-periodic pattern arrangement region of the reflection mask, the multilayer reflection film remains at areas corresponding to positions leaving resist patterns on the processing object.

9. The pattern formation method according to claim 8, wherein the second patterns of the reflection mask are constituted by the multilayer reflection film having a first thickness, the first thickness being a thickness providing a reflectivity with which a light exposure energy at positions of the resist corresponding to arrangement positions of the second patterns becomes larger than the second light exposure energy and smaller than the first light exposure energy.

10. The pattern formation method according to claim 7, wherein the multilayer reflection film is an Mo/Si multilayer film, which includes an Mo film and an Si film alternately stacked in a plurality of layers.

11. The pattern formation method according to claim 1, wherein the resist has sensitivity in wavelengths of EUV light or soft X-rays, and the first developing solution is an aqueous solution of tetramethylammonium hydroxide, and the second developing solution is an aqueous solution of butyl acetate or a mixture solution of anisole and methylisobutyl ketone.

* * * * *